United States Patent
Wagoh et al.

(10) Patent No.: US 7,591,406 B2
(45) Date of Patent: Sep. 22, 2009

(54) SOLDERING METHOD, SOLDERING DEVICE, BONDING METHOD, BONDING DEVICE, AND NOZZLE UNIT

(75) Inventors: Tatsuya Wagoh, Tokyo (JP); Toru Mizuno, Tokyo (JP); Osamu Shindo, Tokyo (JP)

(73) Assignee: TDK Corporation, Tokyo (JP)

( * ) Notice: Subject to any disclaimer, the term of this patent is extended or adjusted under 35 U.S.C. 154(b) by 511 days.

(21) Appl. No.: 11/277,867

(22) Filed: Mar. 29, 2006

(65) Prior Publication Data

US 2006/0219760 A1  Oct. 5, 2006

(30) Foreign Application Priority Data

Mar. 30, 2005 (JP) ............................. 2005-097614
Nov. 4, 2005 (JP) ............................. 2005-320252

(51) Int. Cl.
*B23K 26/00* (2006.01)
(52) U.S. Cl. .................. 228/11; 228/14; 239/96; 222/601; 222/188; 222/590; 222/602; 134/24
(58) Field of Classification Search ............. 239/96; 134/24; 222/601, 188, 590, 602; 228/11, 228/41
See application file for complete search history.

(56) References Cited

U.S. PATENT DOCUMENTS

| 5,506,385 | A | 4/1996 | Murakami et al. |
| 5,977,512 | A * | 11/1999 | Azdasht et al. ........ 219/121.63 |
| 6,152,348 | A | 11/2000 | Finn et al. |
| 2002/0146920 | A1 | 10/2002 | Sugiyama |
| 2004/0069758 | A1 | 4/2004 | Azdasht et al. |
| 2005/0195527 | A1 | 9/2005 | Yamaguchi et al. |
| 2006/0065641 | A1 | 3/2006 | Shindo et al. |

FOREIGN PATENT DOCUMENTS

| JP | 41-18697 | 10/1966 |
| JP | 64-18573 | 1/1989 |
| JP | 2-81763 | 6/1990 |
| JP | 6-23530 | 2/1994 |
| JP | 7-37890 | 2/1995 |

(Continued)

OTHER PUBLICATIONS

U.S. Appl. No. 12/143,267, filed Jun. 20, 2008, Mizuno, et al.

*Primary Examiner*—Kiley Stoner
*Assistant Examiner*—Erin B Saad
(74) *Attorney, Agent, or Firm*—Oblon, Spivak, McClelland, Maier & Neustadt, L.L.P.

(57) ABSTRACT

Provided is a nozzle unit for use in a bonding device in which bonding between a first member and a second member is effected by providing a bonding member that has been melted by heating at a bonding position where the first member and the second member are to be bonded to each other. The nozzle unit includes: a cylindrical nozzle assembly having an accommodating space accommodating the bonding member, and an opening which allows ejection of the bonding member accommodated in the accommodating space onto the bonding position, which has a diameter larger than the diameter of the bonding member, and which communicates with the accommodating space; and a holding/releasing member for releasably holding the bonding member within the accommodating space.

1 Claim, 7 Drawing Sheets

FOREIGN PATENT DOCUMENTS

| | | |
|---|---|---|
| JP | 7-170059 | 7/1995 |
| JP | 11-509375 | 8/1999 |
| JP | 11-514933 | 12/1999 |
| JP | 2002-50017 | 2/2002 |
| JP | 2002-50018 | 2/2002 |
| JP | 2002-76043 | 3/2002 |
| JP | 2002/283049 | 10/2002 |
| JP | 2004-283911 | 10/2004 |
| JP | 2004-534409 | 11/2004 |
| JP | 2005-46895 | 2/2005 |
| JP | 2006-88192 | 4/2006 |
| WO | WO 97/20654 | 6/1997 |
| WO | WO 03/006197 A1 | 1/2003 |

* cited by examiner

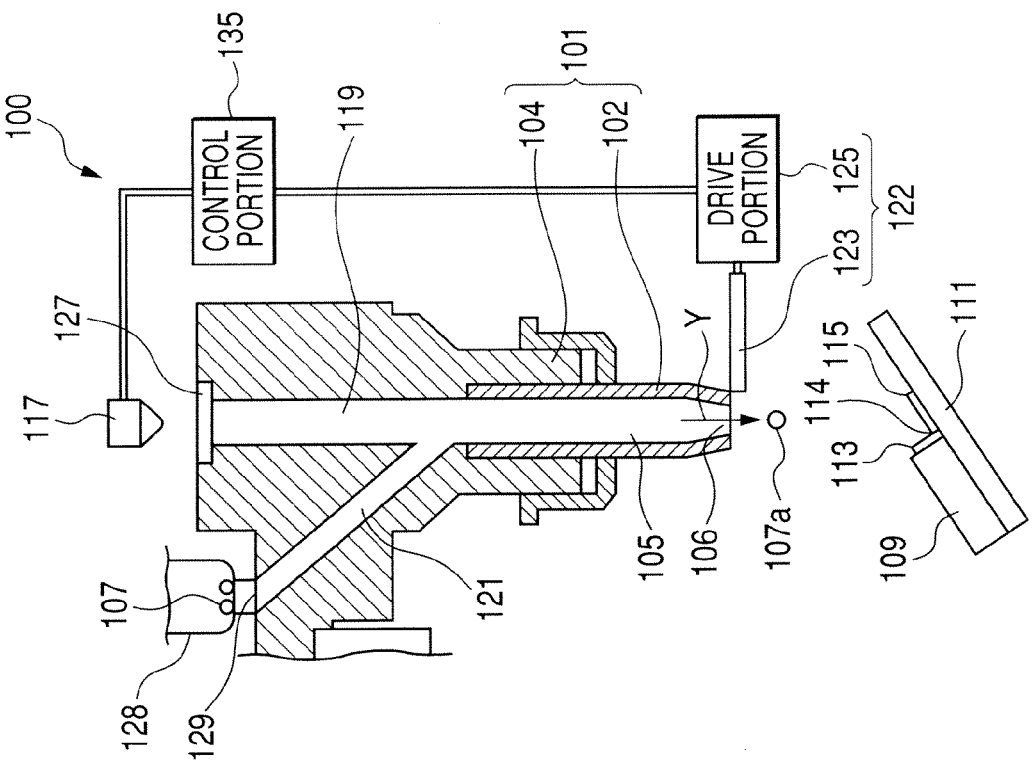
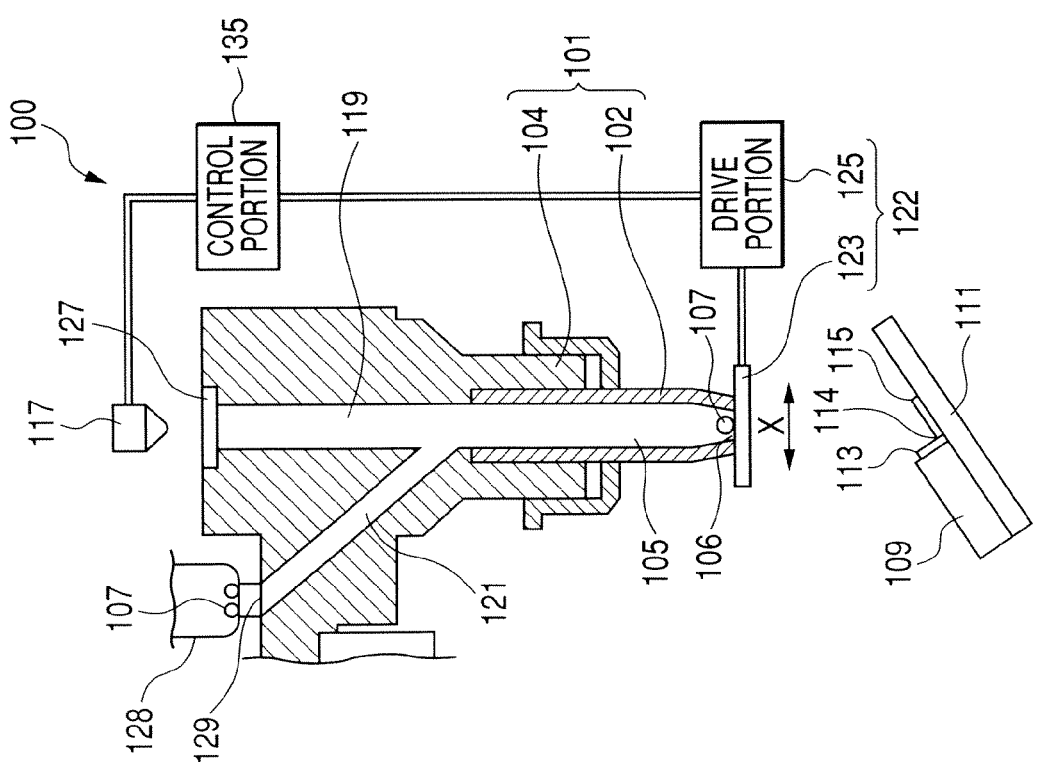

SOLDERING METHOD, SOLDERING DEVICE, BONDING METHOD, BONDING DEVICE, AND NOZZLE UNIT

BACKGROUND OF THE INVENTION

1. Field of the Invention

The present invention relates to a bonding method and a bonding device in which a bonding member is used to bond a first member to a second member.

2. Related Background Art

In a magnetic head manufacturing process, the bonding between a magnetic head slider electrode and a flexure electrode is effected by soldering using a solder ball. To be more specific, the two electrodes are arranged at an angular interval of 90 degrees, and a solder ball is arranged between the electrodes. The ball is melted by heat radiation or the like to effect electrical bonding between these electrodes. In the following, a conventional solder ball soldering device will be described with reference to the drawings.

FIG. 9 is a partial sectional view of a suction nozzle for a soldering process using a conventional soldering device 300. In FIG. 9, reference numeral 309 indicates a slider formed substantially as a parallelepiped, and reference numeral 311 indicates a flexure. A slider electrode 313 is provided at one end of the slider 309. The slider 309 is attached to the flexure 311, which is in the form of a thin plate, and a flexure electrode 315 of the flexure 311 extends so as to be at an angle of approximately 90 degrees with respect to the slider electrode 313. The soldering device for soldering such a workpiece is constructed as follows.

The soldering device is equipped with a conical suction nozzle 301 for conveying a solder ball 307 from a solder reservoir (not shown) to the electrodes to be soldered. The suction nozzle 301 is connected to a suction source (not shown), and the suction force from the suction source is applied to the solder ball 307 through a nozzle inner space 305 and a suction hole 303, and the solder ball 307 is held at the forward end of the suction nozzle 301 through suction. The solder ball 307 sucked by the suction nozzle 301 is held at a position where the solder ball 307 is in contact with the slider electrode 313 and the flexure electrode 315, and in this condition, is melted by a laser beam or the like (not shown). The melted solder ball is fixed in position between the slider electrode and the flexure electrode to effect electrical bonding between the two electrodes.

Recently, as magnetic heads are reduced in size, their electrodes are also becoming increasingly smaller. In the above-described soldering device 300, it is necessary to bring the forward end portion of the suction nozzle 301 close to the electrodes reliably and in a stable manner, with the solder ball 307 being sucked. However, as the electrodes and the peripheral members are reduced in size, it is becoming increasingly difficult to hold the solder ball 307 without unnecessarily bringing the forward end, etc. of the suction nozzle 301 into contact with the electrodes and the peripheral members. In view of this, another type of soldering device has been proposed. In the following, the construction of this other type of soldering device will be described.

FIG. 10 is a partial sectional view of the other type of soldering device. In this soldering device 400, a solid solder ball 407 is melted through heating, and is then ejected onto a substrate to effect soldering.

The soldering device 400 is equipped with a nozzle assembly 401 constituted by a nozzle 402 for ejecting the solder ball 407 and a nozzle main body 413 for holding the nozzle 402, a reservoir portion 415 for storing the plurality of the solder balls 407, and a laser device 417 for melting the solder balls 407. The nozzle 402 is tapered toward the distal end. Inside the nozzle 402, there are provided an accommodating portion 405 and an opening 403. The inner diameter of the portion of the accommodating portion 405 in the vicinity of the opening 403 is smaller than the outer diameter of the solder ball 407. The inner diameter of the rest of the nozzle accommodating portion 405 is larger than the outer diameter of the solder ball 407. Thus, the solid solder ball 407 guided to the accommodating portion 405 of the nozzle 402 is held inside the accommodating portion 405 at a position in the vicinity of the opening 403.

A laser beam from the laser device 417 is introduced into the accommodating portion 405 of the nozzle 402 through a laser introduction path 419 of the nozzle main body portion 413, and is applied to the solder ball 407 held in the vicinity of the opening 403 to melt the solder ball 407. Then, compressed gas from a compressed gas source (not shown) is supplied into the accommodating portion 405, thereby ejecting the molten solder ball 407.

In the soldering device 400, the solder ball 407 is melted inside the accommodating portion 405 of the nozzle 402, so that there is a fear of a portion or all of the molten solder ball 407 adhering to the inner wall surface of the accommodating portion 405 and the portion of the outer wall surface thereof around the opening 403. When, for example, the solder ball 407 adheres to the inner wall surface of the accommodating portion 405, a gap is generated between the next solder ball 407 introduced into the accommodating portion 405 and the inner wall surface of the accommodating portion 405, and compressed gas leaks through this gap, with the result that the proper inner pressure cannot be maintained within the accommodating portion, and the ejection of the molten solder ball may not be effected to a sufficient degree.

Further, at the time of ejection of the molten solder ball 407, the molten solder ball 407 is pulled by the surface tension of the molten solder member adhering to the inner wall surface, so that there is a fear of the molten solder ball being ejected in a direction deviated from the intended ejecting direction. Further, due to the adhering solder member, clogging may occur in the opening 403 of the nozzle 402.

To eliminate the above-mentioned problems, it is necessary to replace the contaminated nozzle or remove the solder member adhering to the inner wall surface and the outer wall surface of the nozzle 402.

SUMMARY OF THE INVENTION

It is accordingly an object of the present invention to provide a bonding device and a bonding method which involve neither clogging of a molten bonding member, such as a solder member, inside the nozzle, nor adhesion of the molten bonding member to the periphery of the opening, making it possible to reliably eject the bonding member. Another object of the present invention is to provide a bonding device, a bonding method, and a nozzle unit which allow bonding without bringing the nozzle forward end portion into contact with an object of bonding, such as an electrode, to which a bonding member is caused to adhere.

One aspect of the present invention relates to a nozzle unit for use in a bonding device in which bonding between a first member and a second member is effected by providing a bonding member that has been melted by heating at a bonding position where the first member and the second member are to be bonded to each other, and the nozzle unit includes: a cylindrical nozzle assembly having an accommodating space accommodating the bonding member, and an opening which allows ejection of the bonding member accommodated in the accommodating space onto the bonding position, which has a diameter larger than the diameter of the bonding member, and which communicates with the accommodating space; and a holding/releasing member for releasably holding the bonding member within the accommodating space.

In this specification, the synchronization of the releasing step (releasing by the holding/releasing means) and the heating step (heating by the heating means) refers to establishment of a relationship between the timing with which the releasing step is performed and the timing with which the heating step is performed. To be more specific, the synchronization of the releasing step and the heating step means that the heating step is performed to start melting the solder member when a positional relationship is attained in which the molten solder member and the holding/releasing means do not interfere with each other. Thus, it is not necessary for the releasing and the irradiation to be effected simultaneously, and it does not matter which of the two is performed first.

In this specification, the term synchronization refers to establishing a relationship in terms of timing between releasing and irradiation, and there is no need for the two to be effected simultaneously.

Further, in this specification, the term bonding member means a member consisting of a metal material, such as solder, gold, or alloy, and capable of connecting members to be bonded to each other.

The above-mentioned first and second members include an electronic component, a substrate, etc., and mean members that can be connected together by a solder member.

BRIEF DESCRIPTION OF THE DRAWINGS

FIG. 1A is a partial sectional view of a soldering device according to Embodiment 1 of the present invention, with its stopper in a closing position;

FIG. 1B is a partial sectional view of the same, with its stopper in an opening position;

DESCRIPTION OF THE PREFERRED EMBODIMENTS

Figure 2:
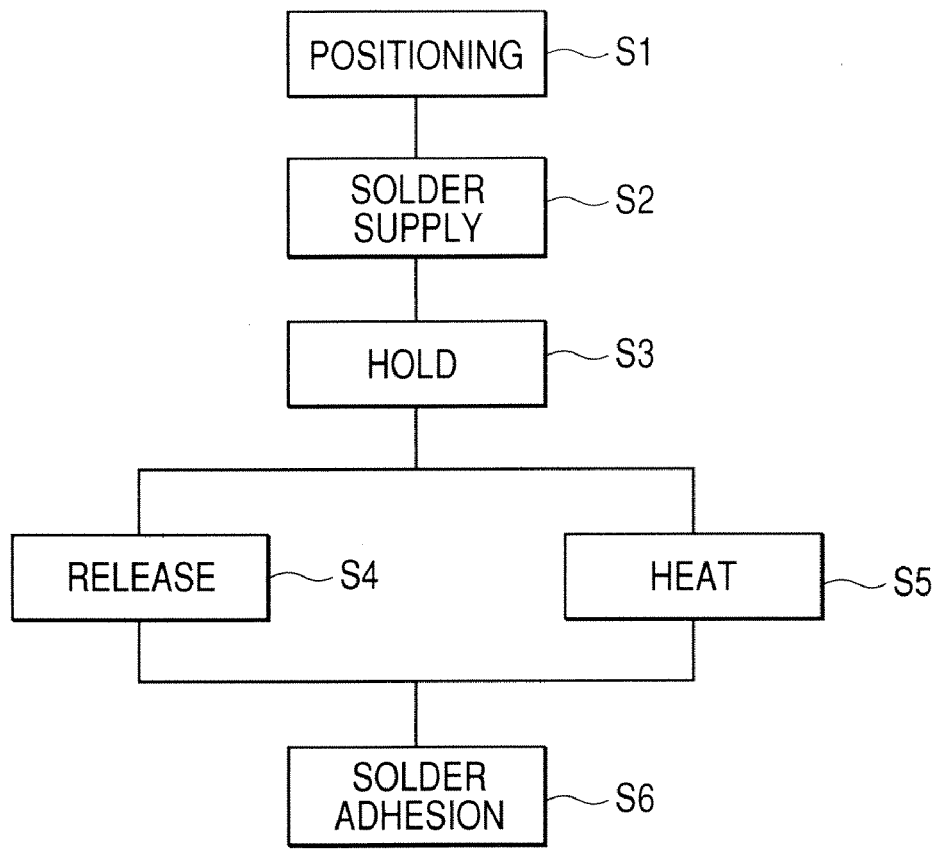
FIG. 2 is a chart illustrating a soldering step.

A solder member is irradiated with heat radiation in the air, and the molten solder member is caused to reach an electrode. In this case, even if the melting is performed to an insufficient degree, due to the partial melting, the solder member adheres to the electrode and stays at a predetermined position thereon. The partially molten solder member is further irradiated with heat radiation even for a short period of time, thereby making it possible to realize an inter-electrode bonding having a sufficient strength.

More preferably, a solder member is supplied through releasing of a solder member held by holding/releasing means, and the releasing by the holding device and the irradiation with heat radiation are synchronized, thus irradiating the solder member existing in the air with heat radiation.

In the following, embodiments of the soldering device and the soldering method of the present invention will be described with reference to the drawings.

Embodiment 1

FIGS. 1A and 1B are partial sectional views of a soldering device according to an embodiment of the present invention. In FIG. 1A, the stopper of the device is in a closing position, and in FIG. 1B, the stopper is in an opening position. In the device of the embodiment shown in FIGS. 1A and 1B, electrical connection is effected between a substantially rectangular magnetic head slider 109 and a flexure 111 having a form of a thin plate to which the slider 109 is to be attached by using a solder member, that is, a spherical solder ball 107.

First, the construction of the slider 109 and the flexure 111 to be soldered will be described. A slider electrode 113 formed of a metal plate is provided on one end surface of the slider 109. On the flexure 111, there is provided a flexure electrode 115 formed of a metal plate, with the slider electrode 113 and the flexure electrode 115 forming a corner portion 114 at an angle of approximately 90 degrees. A molten solder ball 107a is caused to adhere to a portion in the vicinity of the corner portion 114, whereby the slider electrode 109 and the flexure electrode 115 are electrically connected to each other (FIG. 1B).

In performing the soldering, it is important that the solder member should adhere to both the slider electrode 113 and the flexure electrode 115. Thus, in order that the solder member may reliably adhere to the slider electrode 113 and the flexure electrode 115, the flexure 111 is tilted with respect to the horizontal direction, using the corner portion 114 as a positioning V-shaped groove. With this arrangement, even if the position where the solder member drops is deviated from the predetermined position, it is possible to guide the solder ball to the corner portion 114 by the surfaces of the slider electrode 113 and the flexure electrode 115. Thus, the molten solder ball is placed in position in a self-alignment fashion.

The soldering device 100 is equipped with holding/releasing means for releasably holding a solid solder ball 107 at a position spaced apart vertically upwards by a predetermined distance from a predetermined position (corner portion 114) on the flexure electrode 115 where the solder member is firmly attached, heating means, that is, a laser device 117, for applying heat radiation to the solder ball 107 to melt the solder ball 107 through heating, and control means, that is a control portion 135, for synchronizing the timing with which the holding by the holding/releasing means is released and the timing with which heating is effected by the heating means.

The holding/releasing means of this embodiment is constituted by a nozzle assembly 101 and an opening/closing portion 122. The nozzle assembly 101 is equipped with a nozzle 102 for ejecting the solder ball 107, and a nozzle main body 104 to which the nozzle 102 is attached. The opening/closing portion 122 constituting the holding/releasing means is constituted by a stopper 123 for opening and closing an opening 106 of the nozzle 102 described below and a drive portion 125 for driving the stopper 123.

The nozzle 102 of the nozzle assembly 101 is equipped with an accommodating portion 105 for accommodating therein the solder ball 107, and is a cylindrical member with its longitudinal ends open. One longitudinal end of the nozzle 102 is attached to the nozzle main body 104, and the other end thereof constitutes the opening 106 for ejecting the solder ball 107 to the exterior of the nozzle. The diameter of the inner wall of the accommodating portion 105 of the nozzle 102 is larger than at least the outer diameter of the solder ball 107, thus allowing the solder ball 107 to freely roll within the nozzle 102. The diameter of the opening 106 is slightly larger than the solder ball 107, and the opening 106 also functions to perform positioning on the solder ball 107 with respect to the horizontal directions (an x-direction and a y-direction (directions perpendicular to a plane of FIGS. 1A and 1B) of FIGS. 1A and 1B). Thus, when positioning is effected on the nozzle 102, positioning is also effected on the solder ball situated within the opening 106 thereof.

The nozzle main body 104 is equipped with a laser introduction path 119 extending within substantially in a vertical (gravitational) direction (the vertical direction as shown in FIGS. 1A and 1B) and serving to guide a laser beam. An upper end portion of the laser introduction path 119 is closed by attaching thereto a laser beam transmitting portion 127 formed of a glass material allowing transmission of a laser beam. A lower end portion of the laser introduction path 119 is connected to one end of the nozzle 102, with the laser introduction path 119 and the accommodating portion 105 communicating with each other. In this embodiment, the central axes of the laser introduction path 119, the nozzle accommodating portion 105, and the opening 106 are in one straight line.

Further, the nozzle main body 104 is equipped with a solder ball introduction path 121 for guiding solder balls 107 from a reservoir portion 128 described below to the accommodating portion 105 of the nozzle 102. One end of the solder ball introduction path 121 is connected to a solder supply port 129 of the reservoir portion 128, and the other end thereof is connected to the laser introduction path 119 of the nozzle main body 104. Thus, the reservoir portion 128 and the laser introduction path 119 are connected to each other by the solder ball introduction path 121. The inner diameter of the solder ball introduction path 121 is larger than the outer diameter of the solder ball 107, thus allowing the solder ball 107 to roll therein.

Further, arranged above the laser beam transmitting portion 127 of the nozzle assembly 101 is a heating member, that is, a laser device 117, for melting the solder ball 107 through heating by applying heat radiation to the solder ball 107. The laser device 117 is a well-known one. The optical axis of the laser beam emitted from the laser device 117 is aligned in a straight line with the central axes of the laser introduction path 119, the nozzle accommodating portion 105, and the opening 106. Thus, the laser beam is transmitted through the laser beam transmitting portion 127, and enters the laser introduction path 119 of the nozzle main body 104. Further, it passes through the accommodating portion 105 of the nozzle 102, and travels to the exterior of the nozzle assembly 101 through the opening 106.

The opening/closing portion 122 is provided vertically below the opening 106 of the nozzle 102. The stopper 123 of the opening/closing portion 122 is moved by the drive portion 125 between the closing position which is directly below the opening 106 and at which the opening/closing portion 122 closes the opening 106 (as shown in FIG. 1A) and the opening position which is to the right in the x-direction from the position directly below the opening 106 and at which the opening/closing portion 122 opens the opening 106. When the stopper 123 is at the closing position, the solder ball 107 introduced into the accommodating portion 105 is held by the inner wall surface of the nozzle 102 and the upper surface of the stopper 123. When the stopper 123 is moved to the right in the x-direction by the drive portion 125, the opening 106 of the nozzle 102 is opened, and the solder ball 107 falls from the nozzle 102 (in the direction of an arrow Y of FIG. 1B). The nozzle 102 is situated at a position vertically spaced apart by a predetermined distance from a predetermined position on the corner portion 114 to which the solder ball 107 is to adhere, so that the released solder ball falls by its own weight toward the predetermined position.

Further, the soldering device 100 of this embodiment is equipped with the control portion 135 serving as the control means. The control portion 135 outputs a drive command signal for driving the drive portion 125 for the stopper 123 of the opening/closing portion 122, and an irradiation command signal for driving the laser device 117, and can synchronize the timing with which the driving of the stopper 123 toward the opening position is started and the timing with which the laser irradiation by the laser device 117 is started.

Further, the soldering device 100 is connected to the reservoir portion 128 for storing the solder balls 107. The solder supply port 129 of the reservoir portion 128 is connected to one end of the solder ball introduction path 121 of the nozzle main body 104 of the soldering device 100. Thus, the solder ball 107 leaving the solder supply port 129 of the reservoir portion 128 is guided into the laser introduction path 119 and the nozzle accommodating portion 105 through the solder ball introduction path 121.

The steps of a soldering method according to an embodiment of the present invention using the soldering device 100, constructed as described above, will be described with reference to FIGS. 1A, 1B, and 2.

First, by using a movement mechanism (not shown), the nozzle 102 is moved for positioning to a position vertically and upwardly spaced apart by a predetermined distance from a predetermined position on a flexure electrode to which a molten solder ball 107a is to adhere (step S1). As the movement mechanism, there is used, for example, a well-known mechanism capable of causing movement in three axis directions (x-axis, y-axis, and z-axis). A judgment is made as to whether the nozzle has been placed at the predetermined position or not by imaging the nozzle and the object of soldering by means of a positioning camera constituted, for example, by a CCD camera and a monitor for checking an image from the positioning camera.

Next, the solder ball 107 is introduced into the accommodating portion 105 from the reservoir portion 128 by way of the solder introduction path 121 and the laser introduction path 119 (step S2). At this time, the opening/closing portion 122 is in the closing state, and the opening 106 of the nozzle 102 is closed by the stopper 123. Inside the accommodating portion 105, the solder ball 107 is placed on the upper surface of the stopper 123 in the vicinity of the opening 106, and the holding step is completed, in which the solid solder member is held at a position vertically and upwardly spaced apart by a predetermined distance from the position where the solder member is to adhere (step S3).

In the subsequent releasing step, the stopper 123 is moved to the right in the x-direction to release the holding of the solder ball 107, and the solder ball is caused to fall from the opening 106 onto the predetermined position on the flexure electrode 115 vertically below the same (step S4).

In synchronism with the releasing step described above, the heating step is conducted, in which the solder ball 107 having passed the opening 106 is melted through heating by a laser beam from the laser device 117 (step S5). The laser beam passes through the laser beam transmitting portion 127, the laser introduction path 119, the accommodating portion 105, and the opening 106 to heat and melt the solder ball 107 in the air.

The solder ball 107a melted in the air adheres to the corner portion 114 defined by the flexure electrode 115 and the slider electrode 113 (step S6), thereby completing the soldering.

In the above-described soldering method, the melting of the solder ball 107 through heating is effected in the air, that is, upon ejection of the solder ball from the nozzle 102, so that it is possible to prevent the solder ball, heated and melted, from adhering to the inner wall of the nozzle or to the portion of the nozzle around the opening 106.

Embodiment 2

While in Embodiment 1 described above the opening/closing portion 122 is used, it is also possible to effect holding and releasing of the solder ball by using suction means. In the following, Embodiment 2, which uses suction means, will be described.

Figure 3:
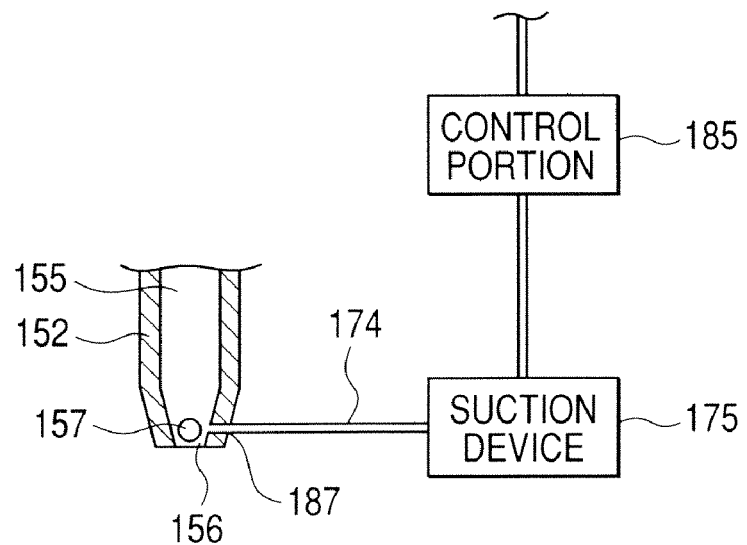
FIG. 3 is a partial sectional view of a nozzle according to Embodiment 2 of the present invention, which is equipped with a suction mechanism.

FIG. 3 is a sectional view of a part of a soldering device equipped with a suction device. Except for the components shown in FIG. 3, components of the soldering device of this embodiment are the same as those of the soldering device of FIG. 1, so the components common to these embodiments are not shown in FIG. 3. A nozzle 152 has a suction port 187 in the vicinity of an opening 156. The suction port 187 extends horizontally (as shown in FIG. 3) through the wall of the nozzle 152, and communicates with an accommodating portion 155. Further, one end of a suction tube 174 is connected to the suction port 187. Suction means, that is, a suction device 175, which generates a suction force, is connected to the other end of the suction tube 174, and the suction force is imparted to the suction port 187 through the suction tube 174. Further, the suction device 175 is connected to a control portion 185. The control portion 185 outputs a drive command signal and a stop command signal for driving and stopping the suction device 175, and a drive command signal for driving a laser device (not shown), and can synchronize the timing with which the imparting of the suction force is stopped and the timing with which the laser irradiation by the laser device is stopped.

In the soldering device, constructed as described above, the suction device 175 is first driven to impart a suction force to the suction port 187. Positioning is effected on the soldering device (see step S1 of FIG. 2), and a solder ball 157 is supplied into the accommodating portion 155 of the nozzle of the soldering device (see step S2 of FIG. 2). By the suction force applied from the suction device 175, the solder ball 157 is held while closing the suction port 187 (see step S3 of FIG. 2). Upon reception of a stop command signal from the control portion 185, the imparting of the suction force from the suction device 175 is stopped, and the solder ball 157 is released (see step S4 of FIG. 2). The solder ball 157 falls by its own weight. The solder ball 157, having passed through the opening 156 and existing in the air, is heated through application of a laser beam (see step S5 of FIG. 2). The molten solder ball adheres to the corner portion of the object of soldering (indicated at 114 of FIGS. 1A and 1B), thereby completing the soldering (see step S6 of FIG. 3).

While in Embodiments 1 and 2 described above the entire solder ball is melted after passing the opening and before reaching the corner portion defined by the flexure electrode and the slider electrode, this should not be construed restrictively. For example, it is also possible for the solder ball to be melted partially. It is also possible to melt solely the portion of the solder member coming into contact with the object of soldering, and continue laser irradiation even after the solder ball has stopped at the predetermined position, thus melting the entire solder ball to perform soldering.

Figure 10:
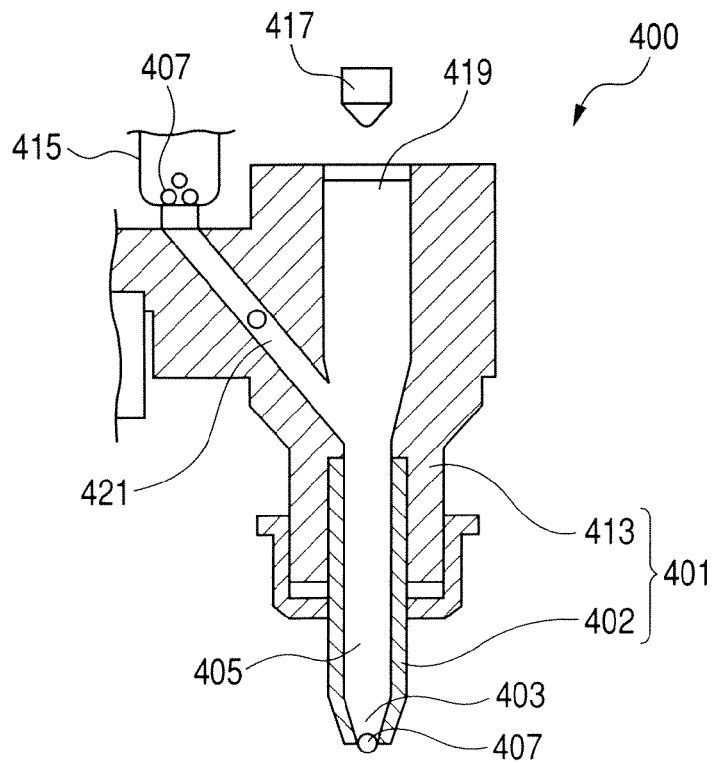
FIG. 10 is a partial sectional view of another soldering device.

As in the case of the soldering device 400 described with reference to FIG. 10, in a soldering method in which the solder ball 407 is melted within the accommodating portion 405 before being ejected, it is necessary to take into consideration viscosity of the molten solder member (the molten solder ball) in setting the pressure value of the compressed gas used when ejecting the solder ball 407. For example, when the pressure value of the compressed gas is smaller than a predetermined value, there is a fear of the solder member clogging the nozzle depending upon the viscosity of the molten solder member.

In contrast, when the pressure value of the compressed gas is larger than the predetermined value, it is possible to eliminate an influence of the viscosity. On the other hand, there is a fear of the molten solder member being scattered in the air or spreading or splashing on the surface of the object of soldering. In the present invention, a solid solder member is caused to fall by its own weight without using any compressed gas, so it is possible to prevent such problems as mentioned above from being caused by the molten solder member.

From the viewpoint of preventing oxidation of the solder member, it is also possible to add to the above-described embodiment of the present invention a well-known gas supply source for supplying compressed gas, and to supply an inert gas (compressed gas), such as nitrogen, into the accommodating portion 105, imparting the compressed gas to the solder member to eject the solder member. Also with this construction, the solder member ejected from the nozzle is solid, so it is possible to set the pressure value of the compressed gas to a value suitable for adhesion to the substrate without taking into consideration the viscosity of the molten solder member, etc. Thus, no problem is involved regarding the adhesion of the solder member.

Embodiment 3

Figure 4:
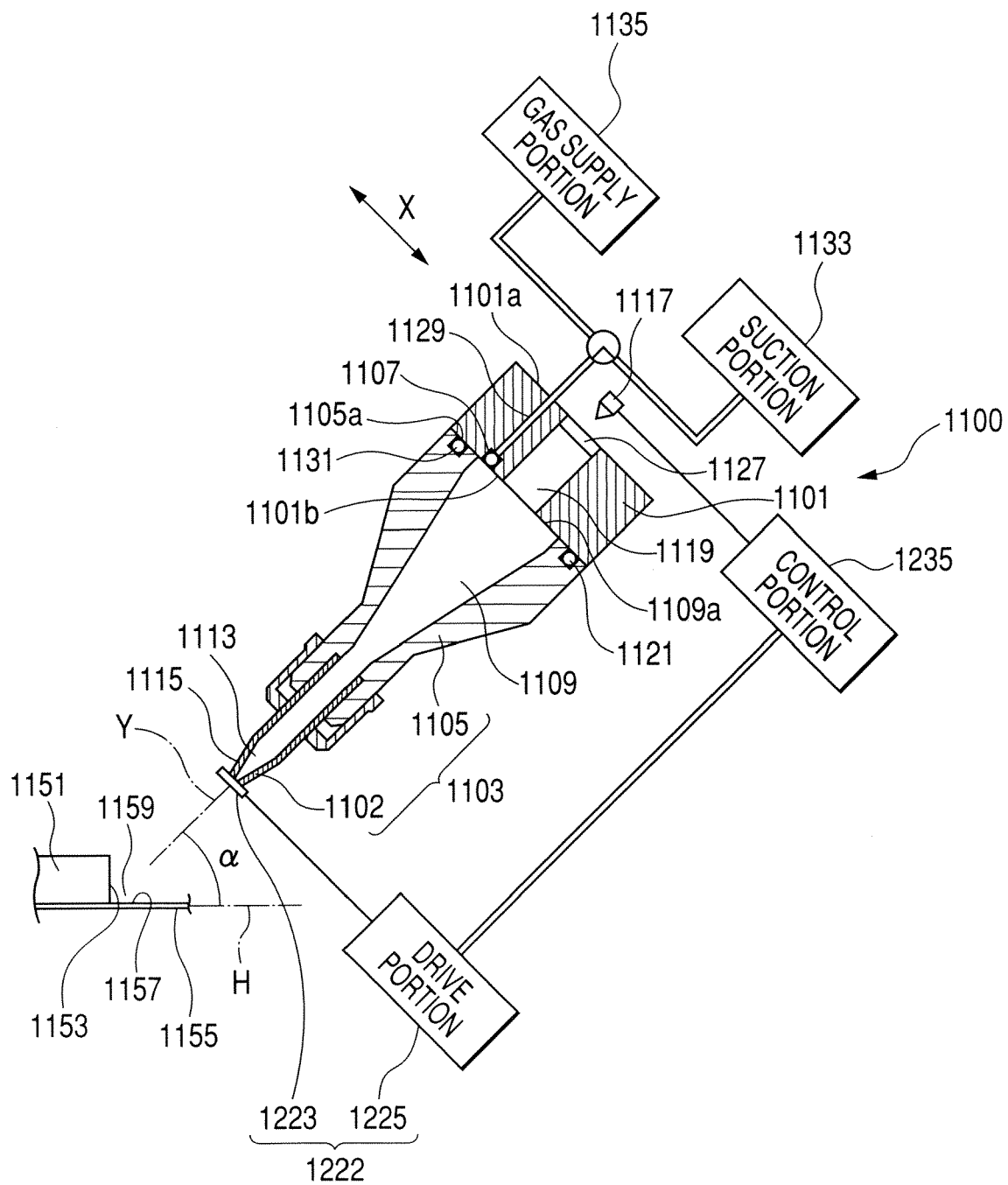
FIG. 4 is a partial sectional view of a soldering device according to Embodiment 3 of the present invention.

In the following, a soldering device according to Embodiment 3 of the present invention will be described, in which compressed gas is imparted to the solder member to eject the solder member. FIG. 4 is a partial sectional view of a soldering device according to Embodiment 3 of the present invention.

A slider 1151 and a flexure 1155, which are to be soldered to each other, are arranged such that slider electrodes 1153 and flexure electrodes 1157 are at an angle of elevation of substantially 90 degrees. There are provided at least four slider electrodes and four flexure electrodes. Temporary positioning is effected on the slider 1151 and the flexure 1155 by an adhesive or a grasping mechanism, and a groove 1159 at an angle of elevation of approximately 90 degrees is formed by the electrodes of the slider 1151 and the flexure 1155. Positioning is effected on a solder nozzle 1102 such that it substantially corresponds to the central position in the width direction (the direction perpendicular to the plane of FIG. 4) of the groove 1159, and a solder ball 1131 is ejected and melted to effect electrical connection between the electrodes. Unlike Embodiments 1 and 2 of the present invention, this embodiment adopts an arrangement in which the flexure to which the slider 1151 is attached extends substantially horizontally.

A soldering device 1100 is equipped with a solder supply portion 1101, that is, a cover member, for conveying a solder member from a reservoir portion (not shown) to an accommodating portion, and a nozzle assembly 1103 for ejecting the solder member. The soldering device 1100 is arranged such that its ejecting direction (indicated by an alternate long and short dash line Y) is inclined by an inclination angle a with respect to the horizontal direction (indicated by an alternate long and short dash line H). The inclination angle can be changed as appropriate according to the soldering position of the object of soldering. To be more specific, the inclination angle may range from 0° (ejection in substantially in the horizontal direction) to 360°.

The substantially cylindrical solder supply portion 1101 is a member detachably attached to the nozzle assembly 1103, and also functions as the cover of the nozzle assembly 1103. The solder supply portion 1101 is equipped with a heat radiation route through which a laser beam for melting the solder member passes. The heat radiation route is constituted by a laser introduction path 1119 and a laser beam transmitting portion 1127. The laser introduction path 1119 extends between an upper surface 1101a and a lower surface 1101b opposed to each other in the transverse direction of the solder supply portion 1101. The opening on the upper surface 1101a side of the laser introduction path 1119 is sealed by the laser beam transmitting portion 1127 formed of a glass material allowing transmission of a laser beam, and exclusively allows transmission of a laser beam. The lower surface 1101b side of the laser introduction path 1119 is open. When the solder supply portion 1101 is attached to the nozzle assembly 1103, the laser introduction path 1119 communicates with an internal space 1109 of a nozzle main body 1105 described below. In this way, while in Embodiments 1 and 2 of the present invention, the laser introduction path and the solder ball introduction path are provided separately, in Embodiment 3 of the present invention, a single introduction path is used as the laser introduction path and the solder ball introduction path.

Further, the solder supply portion 1101 has, radially on the outer side of the laser introduction path 1119, a suction path 1129 extending between the upper surface 1101a and the lower surface 1101b. At the upper surface 1101a side end thereof, the suction path 1129 is connected to a suction portion 1133. The lower surface 1101b side end of the suction path 1129 is connected to a single recess 1131 which is downwardly open. The recess 1131 is a cylindrical groove whose interior is hollow. The diameter of the inner peripheral wall of the recess 1131 is slightly larger than the outer diameter of a solder wall 1107. The diameter of the suction path 1129, connected to the recess 1131, is smaller than the diameter of the inner peripheral wall of the recess 1131. Thus, when a suction force is imparted to the suction path 1129 from the suction portion 1133, a suction force is imparted to the solder ball 1107 through the recess 1131, and one solder ball is accommodated and held in the recess 1131. It is also possible to provide a plurality of suction paths 1129 and recesses 1131.

The upper surface 1101a side end of the suction path 1129 is further connected to a gas supply portion 1135 for supplying compressed gas. That is, the suction path 1129 also functions as a gas supply path. The gas supply route for imparting compressed gas supplied from the gas supply portion 1135 to the solder member is constituted by the suction path 1129 and the recess 1131, and the internal space 1109 and an accommodating portion 1113 that are described below. Compressed gas is imparted to the solder ball through the gas supply route, and the solder ball is ejected. As the compressed gas, an inert gas, such as nitrogen, is used.

Next, the nozzle assembly 1103 will be described. The nozzle assembly 1103 is constituted by the nozzle 1102 for ejecting the solder member, and a nozzle main body 1105 for holding the nozzle 1102. The nozzle main body 1105 is formed substantially as a hollow cone, and the internal space 1109 provided therein is tapered.

A diameter of a solder introduction port 1109a, which is an opening on an upper surface 1105a side of the nozzle main body 1105, is determined such that the recess 1131 is situated within the region of the opening of the solder introduction port 1109a in the state in which the solder supply portion 1101 has been attached to the upper surface 1105a of the nozzle main body 1105. Thus, the recess 1131 directly communicates with the solder introduction port 1109a. When the solder ball 1107 held by the recess 1131 is released, and compressed gas is imparted thereto, the solder ball 1107 is moved from the solder introduction port 1109a to the internal space 1109 of the nozzle main body 1105. That is, the internal space 1109 functions as a supply route for the solder member.

Further, the internal space 1109 of the nozzle main body 1105 also functions as a laser route through which a laser beam passes.

An O-ring 1121 is fitted into an upper surface 1105a of the nozzle main body 1105. When the lower surface 1101b of the solder supply portion 1101 is attached to the upper surface 1105a of the nozzle main body 1105, the nozzle main body 1105 and the solder supply portion 1101 are brought into intimate contact with each other through the intermediation of the O-ring 1121. As means for fixing the solder supply portion 1101 to the nozzle assembly 1103, there is used, for example, well-known means such as a mechanism which presses the solder supply portion 1101 against the nozzle assembly by imparting a load larger than the inner pressure of the internal space 1109 to the solder supply portion 1101.

The nozzle 1102 is a tapered cylindrical member, and contains an accommodating portion 1113, with its longitudinally opposing ends being open. The upper end of the nozzle 1102 is attached to the nozzle main body 1105, and the lower end thereof constitutes an opening 1115 for ejecting the solder ball 1107 to the exterior of the nozzle.

The diameter of the inner wall of the accommodating portion 1113 and the diameter of the opening 1115 are at least larger than the outer diameter of the solder ball 1107, allowing the solder ball 1107 to move freely within the nozzle 1102.

Further, the soldering device 1100 of Embodiment 3 of the present invention is equipped with holding/releasing means for releasably holding the solid solder ball 1107 at a position spaced apart by a predetermined distance from the soldering position (the corner portion 1159) where the solder member is to be firmly attached to the flexure electrodes 1157 and the slider electrodes 1153, heating means, that is, a laser device 1117, for imparting heat radiation to the solder ball 1107 to melt the solder ball 1107 through heating, and control means, that is, a control portion 1235, for synchronizing a timing with which the holding by the holding/releasing means is released and a timing with which heating is effected by the heating means.

The holding/releasing means is constituted by the above-mentioned nozzle assembly 1103 and an opening/closing portion 1222. The opening/closing portion 1222 is constituted by a stopper 1223 for opening and closing the opening 1115 of the nozzle 1102, and a drive portion 1225 for driving the stopper 1223 (in the x-direction).

The control portion 1235 is connected to the drive portion 1225 for the stopper 1223 of the opening/closing portion 1222 and to the laser device 1117, and synchronizes a timing with which the driving of the stopper 1223 to the opening position is started and a timing with which laser irradiation by the laser device 1117 is started.

Further, the interior of the accommodating portion 1113 of the nozzle 1102 also constitutes the laser optical path through which the laser beam passes. In Embodiment 3 of the present invention, components are arranged such that the respective central axes of the laser introduction path 1119 of the solder supply portion 1101, the internal space 1109 of the nozzle main body 1105, the accommodating portion 1113 of the nozzle 1102, and the opening 1115, are in a straight line. Thus, the laser beam having passed the laser introduction path 1119 enters the internal space 1109, and passes through the accommodating portion 1113 of the nozzle 1102 before being applied to the solder ball 1107.

Further, when the solder supply portion is attached to the nozzle assembly, the laser introduction path 1119, the internal space 1109, and the accommodating portion 1113 are brought into a sealed state except for the opening 1115.

In the soldering device constructed as described above, the step for conveying the solder ball 1107 is conducted as follows. The suction portion 1133 is driven to hold the solder ball 1107 in the recess 1131 through suction. The solder supply portion 1101 holding the solder ball 1107 through suction is moved in the x-direction, and the solder supply portion 1101 is attached to the nozzle assembly 1103. This state is shown in FIG. 4. Next, the suction force applied to the solder ball 1107 from the suction portion 1133 is canceled. Then, the gas supply portion 1135 is operated to impart compressed gas to the solder ball 1107, and the solder ball 1107 is introduced into the internal space 1109. The solder ball 1107 passes through the internal space 1109 and the accommodating portion 1113 of the nozzle 1102, and reaches a portion in the vicinity of the opening 1115 to be retained by the stopper 1223 and the nozzle 1102.

The operation of the soldering device using the solder supply portion 1101 constructed as described above is as follows.

When the step of conveying the solder ball 1107 is completed, positioning is performed on the soldering device 1100 loaded with the solder ball 1107. The soldering device is moved such that the nozzle opening 1115 is situated at a position spaced apart by a predetermined distance in the direction of the inclination angle a with respect to the horizontal direction H from substantially the central position in the width direction of the groove 1159 formed by the slider electrodes 1153 and the flexure electrodes 1157 to which the molten solder ball 1107 is to adhere. As the movement mechanism, there is used, for example, a well-known mechanism capable of causing movement in three axial directions (x-axis, y-axis, and z-axis).

The suction force applied to the solder ball 1107 from the suction portion 1133 is canceled and, at the same time, compressed gas is imparted to the solder ball 1107 from the gas supply portion 1135 through the suction path 1129. The solder ball 1107, which has been held by the recess 1131, moves in the direction of the opening 1115, and is positioned on the stopper 1223 closing the opening 1115.

Next, when the drive portion 1225 of the stopper 1223 is driven, the stopper 1223 moves to open the opening 1115. After the opening 1115 is opened, there is conducted laser irradiation to melt the solder ball 1107. The imparting of compressed gas is effected as appropriate before and after the opening of the stopper. That is, before the opening of the stopper, the solder ball is positioned on the stopper by imparting compressed gas thereto. After the opening of the stopper, the solder ball is ejected to the exterior of the nozzle 1102 from the opening 1115 by compressed gas.

A laser beam emitted from the laser device 1117 passes through the laser transmitting portion 1127, and passes through the laser introduction path 1119, and the internal space 1109 before being applied to and melting the solid solder ball ejected from the opening 1115.

The melted solder ball 1107 adheres to a predetermined portion (the groove portion 1159), thereby completing the soldering.

In the soldering device equipped with the above-described solder supply portion, it is possible to hold the solder ball in a sealed space, so that the pressure value of the compressed gas used for ejection can be set at a predetermined value reliably and easily, making it possible to eject the solder ball reliably.

Further, regardless of the direction in which the solder ball is ejected from the soldering device, it is possible to cause the solder ball to reach a given soldering position.

(Construction of the Opening/Closing Portion)

Specific examples of the construction of the opening/closing portion that can be applied to Embodiments 1 through 3 of the present invention will be described with reference to the drawings.

Construction Example 1

Figure 5:
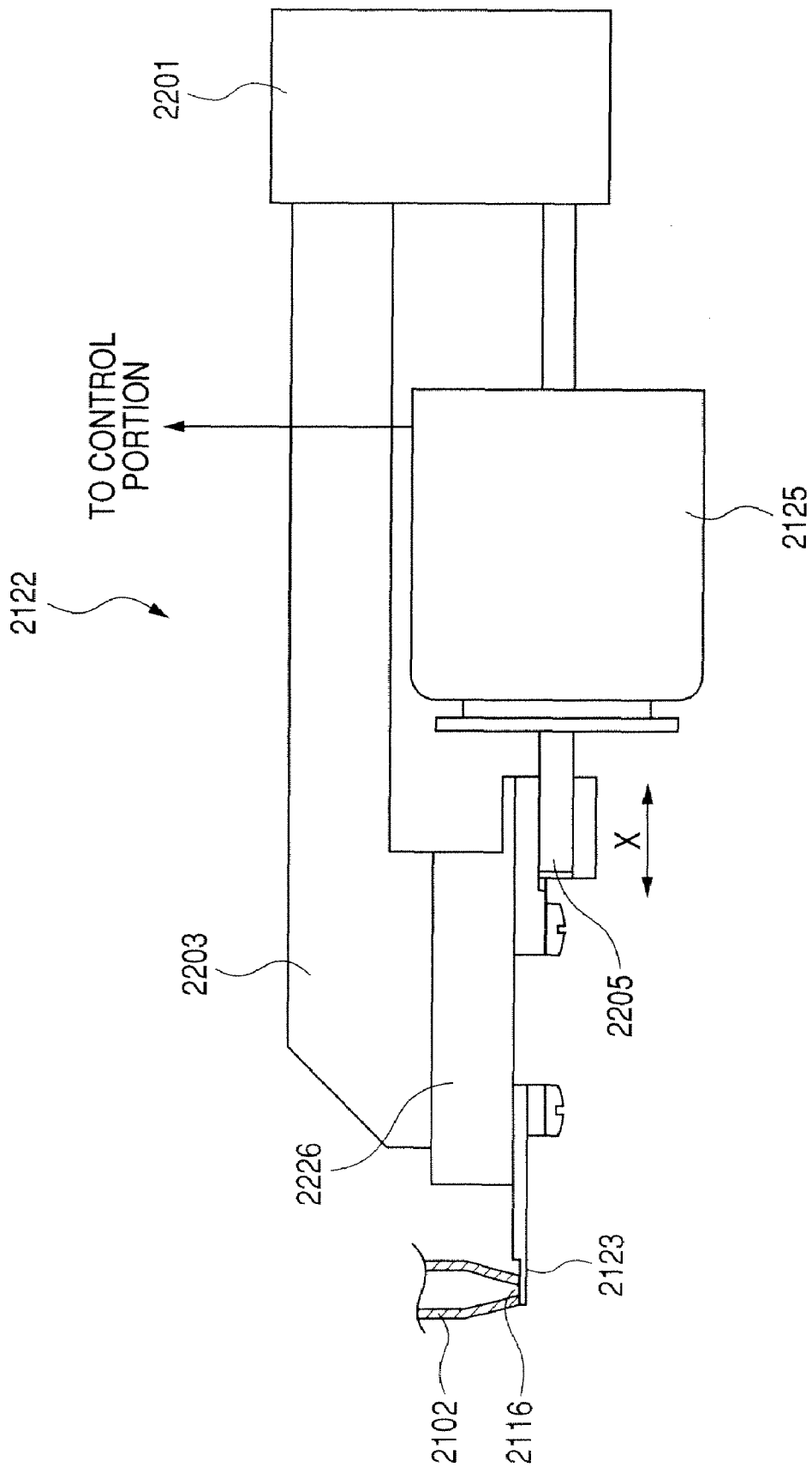
FIG. 5 is a front view of an opening/closing portion equipped with an electromagnetic solenoid type actuator.

An opening/closing portion according to Construction Example 1 is of a direct-acting type utilizing an electromagnetic solenoid type actuator as the drive source. FIG. 5 is a front view of an opening/closing portion equipped with an electromagnetic solenoid type actuator in a state in which the opening is closed. An opening/closing portion 2122 according to Construction Example 1 is equipped with a stopper 2123 for closing an opening 2116 of a nozzle 2102, a drive portion, that is, an electromagnetic solenoid type actuator 2125, for effecting opening and closing by moving the stopper 2123 in an X-direction, an opening/closing portion main body 2201 for holding the stopper 2116 and the electromagnetic solenoid type actuator 2125, a guide 2226 for allowing the stopper 2123 to reciprocate in the horizontal direction, and an arm member 2203 supported by the opening/closing portion main body 2201 and holding the guide 2226.

Further, there is provided a rod 2205 attached to a moving core in the electromagnetic solenoid type actuator.

Further, one end of the arm member 2203 is fixed to the opening/closing portion main body 2201. The other end of the arm member 2203 is connected to one end of the rod 2205 of the actuator 2125 and the stopper 2123 through the guide 2226. Thus, when the rod 2205 reciprocates (in the X-direction), the stopper 2123 is caused to reciprocate in the X-direction through the guide 2226.

Upon reception of a drive signal from a control portion, the opening/closing portion 2122 constructed as described above moves in the X-direction (to the right as seen FIG. 5) to open the opening 2116 or moves to the left to close the opening 2116.

Construction Example 2

Figure 6:
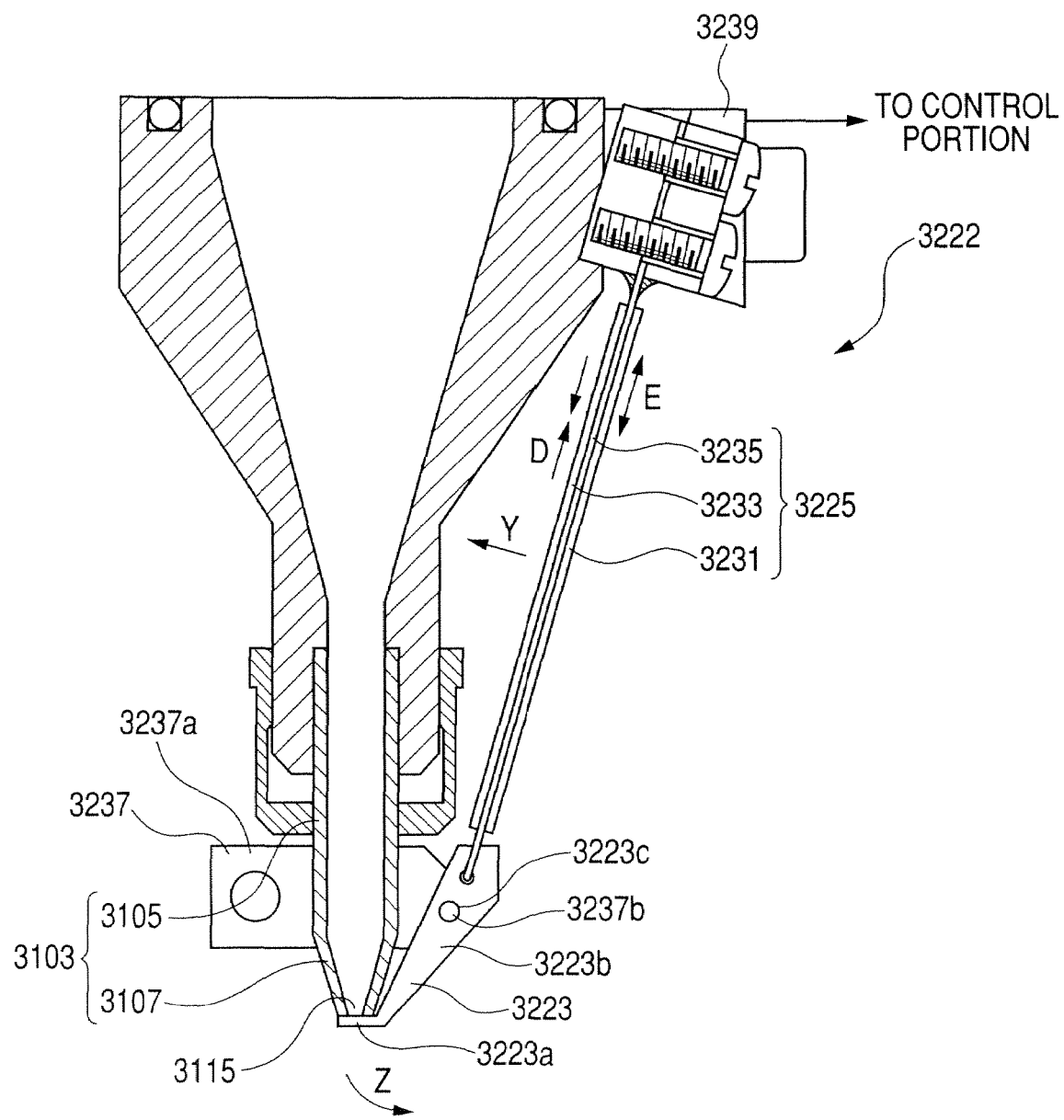
FIG. 6 is a sectional view of a nozzle assembly into which an opening/closing portion equipped with a piezoelectric actuator is incorporated.

An opening/closing portion according to Construction Example 2 is a pivotal type one utilizing a piezoelectric actuator. FIG. 6 is a sectional view of a nozzle assembly to which an opening/closing portion equipped with a piezoelectric actuator is applied. In a state shown FIG. 6, an opening 3115 is closed by an opening/closing portion 3222. A nozzle assembly 3103 is substantially of the same construction as the nozzle assembly 1103 shown in FIG. 4, so only the difference between them will be described.

Attached to the outer periphery of a nozzle main body 3105 are a stopper 3223 constituting the opening/closing portion 3222, and a piezoelectric actuator 3225, which is a drive portion for driving the stopper 3223.

The stopper 3223 has a substantially L-shaped configuration, and is equipped with a flat portion 3223a closing the opening 3115 of a nozzle 3107, and a stopper main body portion 3223b continuous with the flat portion 3223a through a bent portion. The stopper main body portion 3223b is equipped with an opening 3223c attached to a pin 3237b of a stationary block 3237 described below.

The stationary block 3237, which fixes the stopper 3223 to the nozzle 3107, is constituted by a cylindrical hole portion formed in conformity with the outer periphery of the nozzle 3107, and a split fastening portion fixed by using a screw or the like. The pin 3237b, which has an outer diameter somewhat smaller than the diameter of the opening 3223c of the stopper 3223, protrudes from a block piece 3237a, and the stopper 3223 can rotate around the pin 3237b as an axis. The stopper 3223 is attached to the block piece 3237a through the intermediation of the pin 3237b.

Further, connected to the stopper 3223 is one end of the drive portion, that is, the piezoelectric actuator 3225. The actuator 3225 is a so-called bending actuator, with piezoelectric elements 3233 and 3235 being attached to either side of a plate-like metal shim member 3231. The other end of the actuator is fixed to the nozzle main body 3105 through the intermediation of a second stationary block 3239 fixed to the upper portion of the nozzle main body 3105.

When the actuator is at a normal position (a state shown in FIG. 6), the stopper 3233 closes the opening 3115. To open the opening 3115, a voltage is applied to the piezoelectric elements 3233 and 3235 to contract one piezoelectric element 3233 (as indicated by arrows D) and to expand the other piezoelectric element 3235 (as indicated by arrows E), bending the actuator 3225 toward the nozzle main body 3105 (as indicated by an arrow Y). The stopper 3233 connected to the actuator 3225 rotates around the pin 3223c (as indicated by an arrow Z) to open the opening 3107.

Construction Example 3

Figure 7:
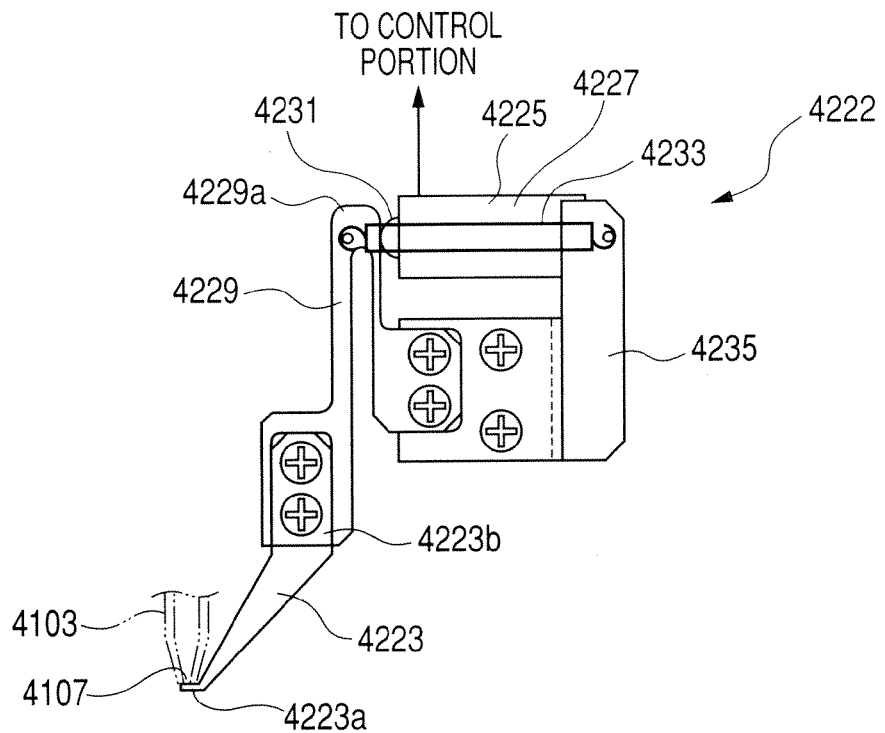
FIG. 7 is a front view of an opening/closing portion utilizing another type of piezoelectric actuator.

An opening/closing portion according to Construction Example 3 is a pivotal type one utilizing another type of piezoelectric actuator. FIG. 7 is a front view of the opening/closing portion. In a state shown in FIG. 7, an opening 4107 is closed by a stopper 4223. In FIG. 7, only the nozzle 4107 of a nozzle assembly is indicated by a phantom line. Since the nozzle assembly is of the same construction as the nozzle assembly 1103 of FIG. 4, a description thereof will be omitted.

An opening/closing portion 4222 is equipped with the stopper 4223 and a piezoelectric actuator 4225, which is a drive portion for driving the stopper 4223. The stopper 4223 has a substantially L-shaped configuration, and is equipped with a flat portion 4223a closing the opening 4107, and a stationary portion 4223b connected to a plate spring 4229 described below.

The actuator 4225 is a so-called stack type piezoelectric actuator. The actuator 4225 is constituted by a cylindrical casing 4227 whose one end is open, a stack type piezoelectric element (not shown) arranged inside the casing 4227, and a protrusion 4231 which connected to the piezoelectric element and which protrudes from the opening of the casing 4227 and is movable. The closed other end of the casing 4227 opposed to the opening thereof is fixed to an opening/closing portion main body 4235. A coil spring 4233 is suspended between a bent portion 4229a of the plate spring 4229 and the opening/closing portion main body 4235 so as to extend in the longitudinal direction of the actuator 4227. A pre-load is imparted to the piezoelectric element by the coil spring 4233.

In the above-described construction, when a voltage is applied to the piezoelectric element, the piezoelectric element expands, and the protrusion 4231 presses the bent portion 4229a of the plate spring to the left as seen in FIG. 7, so that the bent portion 4229a of the plate spring is tilted (deflected) counterclockwise, and the stopper 4223 connected thereto rotates to the right as seen in FIG. 7 to thereby open the opening 4107. In a state in which no voltage is applied to the piezoelectric element, the piezoelectric element is restored to the normal (contracted) state, and the opening 4107 is closed.

Construction Example 4

Figure 8:
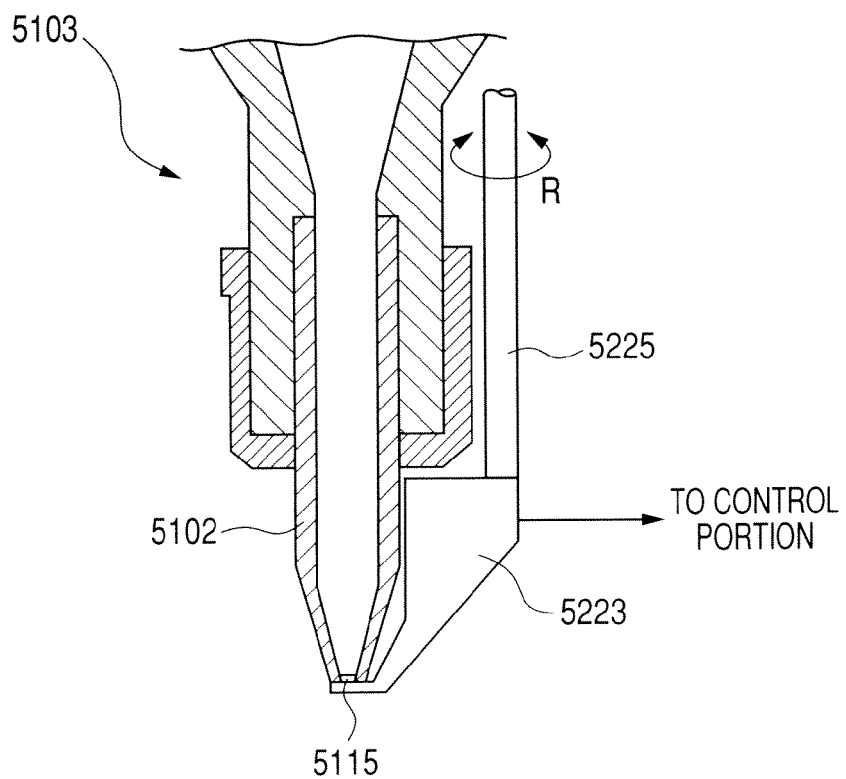
FIG. 8 is a front view of a swiveling type opening/closing portion.
Figure 9:
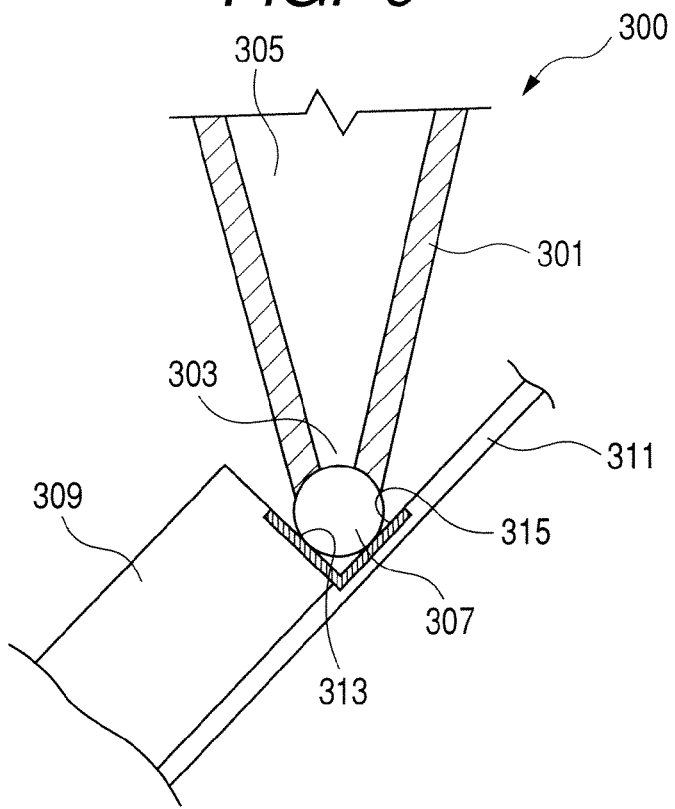
FIG. 9 is a partial sectional view of a conventional first soldering device.

An opening/closing portion according to Construction Example 4 is a swivel type one in which opening/closing is effected by swiveling a stopper. FIG. 8 is a front view of the opening/closing portion. A nozzle assembly 5103 is substantially of the same construction as the nozzle assembly 1103 shown in FIG. 4, so a description thereof will be omitted.

One end portion of a stopper 5223 closes an opening 5115 of a nozzle 5102, and the other end portion of the stopper 5223 is supported by a shaft 5225. The shaft 5225 is connected to a rotary drive portion (not shown), and the shaft 5225 is rotated (pivoted) in the directions of arrows R by the rotary drive portion. In the opening/closing portion constructed as described above, the opening 5115 of the nozzle 5102 is opened or closed by the stopper 5223 according to the rotating position of the shaft 5225. It goes without saying that the rotary drive portion (not shown) may be constituted by a rotary drive system, such as a pulse motor. However, it is also possible to adopt a construction in which the motion of a direct-acting type drive system, such as a piezoelectric actuator, is converted to a rotary motion.

EXAMPLES

In the following, an example will be described in which a soldering operation was conducted by using soldering devices according to Embodiment 3 of the present invention.

The object of soldering was a gold electrode member with a plane of 0.95 mm×0.6 mm. The solder ball used was a spherical body with a diameter of 110 μm. Nitrogen gas was used as a compressed gas. A distance from a nozzle forward end to the soldering position of a workpiece was 0.5 mm. A laser used was a YAG laser with a wavelength of 1064 nm, and an irradiation time for a laser beam was 0.3 msec as from the irradiation start. The spot diameter of the laser beam was φ200 μm at the soldering position.

The table below shows the results of Examples 1 through 3 in which soldering operation was performed under the above conditions, with the period of time from the shutter opening to the laser irradiation start and the pressure value of the compressed gas being varied.

| Example | Time elapsed after stopper opening | Compressed gas pressure | Soldering state |
| --- | --- | --- | --- |
| 1 | 800 μsec | 1.0 kPa | Satisfactory |
| 2 | 700 μsec | 2.0 kPa | Satisfactory |
| 3 | 600 μsec | 2.5 kPa | Satisfactory |

As can be seen from the above table, in all of Examples 1 through 3, soldering can be performed in a satisfactory manner at a predetermined position.

In accordance with Embodiments 1, 2, and 3, there are provided a soldering method and a soldering device in which a solid solder member is held at a position spaced apart from a substrate by a predetermined distance and in which the holding of the solder member is released at that position to impart heat radiation to the solder member in the air. Thus, a molten solder member is not held, so it is possible to prevent contamination of means for holding the solder member, such as a nozzle.

Further, soldering is performed with the solder holding/releasing member spaced apart from the electrode, so it is possible to prevent the solder holding/releasing means from coming into contact with the electrode, which constitutes the object of soldering, thus making it possible to prevent damage of the electrode or the solder holding member.

While in Embodiments 1, 2, and 3 as described above a laser device is used, it is also possible to heat and melt the solder ball, that is, the solder member, by using halogen light, hot air, etc. Further, while in the above embodiments a spherical solder ball is used as the solder member, the configuration of the solder member is not particularly restricted to a spherical one.

Further, while in the above embodiments the optical axis of the laser beam, the central axis of the laser introduction path, the central axis of the accommodating portion, and the central axis of the opening are caused to coincide with each other in the same direction, this should not be construed restrictively. Any type of device will do as long as it is a laser device capable of scanning with a laser beam along the path taken by the solder ball falling from the opening, and it goes without saying that there is no need to match the optical axis of the laser beam with the path taken by the falling solder ball after its ejection.

Further, the holding/releasing member is not restricted to that of the above embodiments. For example, as the nozzle opening/closing mechanism, it is also possible to adopt an iris structure or a split tip structure constituted by a plurality of fins.

Further, it is necessary to synchronize the releasing of the ball with the application of the laser beam so that the solder can be melted while it is in the air, i.e., before it reaches the electrode. That is, as long as the releasing of the ball and the laser irradiation are substantially synchronized with each other, it does not matter which of the two is effected first.

Further, while in this specification the bonding member for the electrode is solder, this should not be construed restrictively. For example, it is also possible to use some other metal, such as gold, or an alloy.

Further, while in this specification the gas supplied into the nozzle is an inert gas (nitrogen), it is also possible to use a gas (such as hydrogen) capable of reducing the bonding member.

This invention can be embodied in a large number of forms without departing from the essential characteristics thereof. Thus, the above-described embodiments are only given by way of illustration, and it goes without saying that it should not be construed restrictively.

This application claims priority from Japanese Patent Application No. 2005-97614 filed Mar. 30, 2005 and No. 2005-320252 filed Nov. 4, 2005, which is hereby incorporated by reference herein.

What is claimed is:

1. A bonding device for bonding an electronic component to a substrate, comprising:
    holding/releasing means for releasably holding a solid bonding member at a position spaced apart by a predetermined distance from a bonding position on the substrate to which the electronic component is bonded;
    ejecting means for ejecting the bonding member onto the bonding position;
    heating means for heating the bonding member by applying heat radiation to impart heat to the bonding member; and
    control means for synchronizing releasing of the holding by the holding/releasing means and the heating by the heating means,
    wherein, after releasing the holding of the bonding member by the control means, the bonding member is heated to thereby bond the electronic component to the bonding position on the substrate,
    wherein the holding/releasing means effects the holding or the releasing of the bonding member by a direct-acting system, a pivoting system, or a swiveling system, and
    wherein the holding/releasing means has a nozzle assembly with an opening and an opening/closing member for opening and closing the opening, and wherein the opening/closing member is driven by a piezoelectric actuator.

* * * * *